United States Patent
Peng et al.

(10) Patent No.: US 10,109,496 B2
(45) Date of Patent: Oct. 23, 2018

(54) CHAMBER CLEANING AND SEMICONDUCTOR ETCHING GASES

(71) Applicant: THE CHEMOURS COMPANY FC, LLC, Wilmington, DE (US)

(72) Inventors: Sheng Peng, Hockessin, DE (US); Gary Loh, Newark, DE (US); Yoshimasa Oosaki, Tokyo (JP)

(73) Assignee: THE CHEMOURS COMPANY FC, LLC, Wilmington, DE (US)

( * ) Notice: Subject to any disclaimer, the term of this patent is extended or adjusted under 35 U.S.C. 154(b) by 0 days.

(21) Appl. No.: 15/106,889

(22) PCT Filed: Dec. 22, 2014

(86) PCT No.: PCT/US2014/071927
§ 371 (c)(1),
(2) Date: Jun. 21, 2016

(87) PCT Pub. No.: WO2015/103003
PCT Pub. Date: Jul. 9, 2015

(65) Prior Publication Data
US 2016/0343579 A1   Nov. 24, 2016

Related U.S. Application Data

(60) Provisional application No. 61/921,594, filed on Dec. 30, 2013.

(51) Int. Cl.
| | |
|---|---|
| *H01L 21/311* | (2006.01) |
| *H01L 21/3065* | (2006.01) |
| *C09K 13/08* | (2006.01) |
| *C09K 13/00* | (2006.01) |
| *C23C 16/44* | (2006.01) |
| *C23G 5/00* | (2006.01) |
| *H01J 37/32* | (2006.01) |

(52) U.S. Cl.
CPC ........ *H01L 21/31116* (2013.01); *C09K 13/00* (2013.01); *C09K 13/08* (2013.01); *C23C 16/4405* (2013.01); *C23G 5/00* (2013.01); *H01J 37/32009* (2013.01); *H01J 37/3244* (2013.01); *H01L 21/3065* (2013.01); *H01L 21/31144* (2013.01); *H01J 2237/334* (2013.01); *H01J 2237/3321* (2013.01); *Y02C 20/30* (2013.01); *Y02P 70/605* (2015.11)

(58) Field of Classification Search
None
See application file for complete search history.

(56) References Cited

U.S. PATENT DOCUMENTS

| | | |
|---|---|---|
| 6,449,521 B1 | 9/2002 | Gupta |
| 8,187,415 B2 | 5/2012 | Kim et al. |
| 2003/0000913 A1* | 1/2003 | Hung ................ H01L 21/31116 216/2 |
| 2004/0035825 A1 | 2/2004 | Nakamura et al. |
| 2005/0258137 A1 | 11/2005 | Sawin et al. |
| 2009/0176375 A1* | 7/2009 | Benson ................. C09K 13/00 438/719 |
| 2013/0105728 A1* | 5/2013 | Umezaki ........... H01L 21/31116 252/79.1 |
| 2014/0302683 A1 | 10/2014 | Kikuchi et al. |

FOREIGN PATENT DOCUMENTS

| | | |
|---|---|---|
| CN | 101163816 | 4/2008 |
| EP | 1529854 A1 | 5/2005 |
| EP | 2595179 A1 | 5/2013 |
| JP | 2004-06554 | 1/2004 |
| JP | 2008-244144 | 10/2008 |
| JP | 2011-124239 | 6/2011 |
| WO | 2005090638 A2 | 9/2005 |
| WO | 2010100254 A1 | 9/2010 |
| WO | 2013015033 A1 | 1/2013 |

OTHER PUBLICATIONS

PCT International Preliminary Report on Patentability dated Jul. 5, 2016.*
International Search Report and Written Opinion, dated Feb. 26, 2015, PCT/US2014/071927.
Chinese Office Action in Chinese Application No. 201480076636.2, dated Mar. 9, 2018, 6 pages (with English translation).
Japanese Office Action in Japanese Application No. 2016-544081, dated Mar. 13, 2018, 22 pages (with English translation).

* cited by examiner

*Primary Examiner* — Jiong-Ping Liu

(57) ABSTRACT

The present invention relates to fluoroolefin compositions useful as gases for CVD semiconductor manufacture, particularly for etching applications including methods for removing surface deposits from the interior of a chemical vapor deposition chamber by using an activated gas mixture, and methods for etching the surface of a semiconductor.

22 Claims, No Drawings

CHAMBER CLEANING AND SEMICONDUCTOR ETCHING GASES

FIELD OF THE INVENTION

The present invention relates to perfluoroalkyne compositions useful in semiconductor manufacturing applications, such as etching semiconductors and as cleaning gases for removing surface deposits in CVD and PECVD chambers. The invention further relates to methods for removing surface deposits from the interior of a chemical vapor deposition chamber by using an activated gas mixture created by activating a gas mixture in the chamber or in a remote chamber, where the gas mixture includes a fluoroolefin, such as a perfluoroalkyne, and oxygen.

BACKGROUND OF THE INVENTION

Etching gases and cleaning gases are to manufacture semiconductors. For example, chemical vapor deposition (CVD) and plasma enhanced chemical vapor deposition (PECVD) chambers need to be regularly cleaned to remove deposits from the chamber walls and platens. This cleaning process reduces the productive capacity of the chamber since the chamber is out of active service during a cleaning cycle. The cleaning process may include, for example, the evacuation of reactant gases and their replacement with a cleaning gas, activation of that gas, followed by a flushing step to remove the cleaning gas from the chamber using an inert carrier gas. The cleaning gases typically work by etching the contaminant build-up from the interior surfaces, thus the etching rate of the cleaning gas is an important parameter in the utility and commercial use of the gases, and some cleaning gases can also be used as etching gases. In addition, present cleaning gases have significant amounts of components with high global warming potentials. For example, U.S. Pat. No. 6,449,521 discloses a mixture of 54% oxygen, 40% perfluoroethane and 6% $NF_3$ as a cleaning gas for CVD chambers. However, perfluoroethane has a relatively high GWP, estimated to be on the order of 6200 at a time horizon of 20 years, and 14000 at a time horizon of 500 years. Other cleaning gases include $C3F8$, which also has a significant global warming potential. Other gases include, for example, those described in U.S. Pat. No. 6,242,359, which discloses unsaturated flurorine containing oxides, e.g. hexafluoropropene oxide (CF3CFOCF2), perfluoropropane-dial (CFOCF2CFO), trifluoromethanol (CF3OH), difluoromethanol (CHF2OH), difluorooxyfluoromethane (CHF2OF), perfluorodiethyl ether (C2F5OC2F5), 1,1,3,3-tetrafluorodimethyl ether (CHF2OCHF2), and the like. Moreover, even when processes are optimized, there is the potential for release of the cleaning gases. Finally, given the chemical stability of these gases, their activation can be energy intensive. A variety of reactors are useful in producing semiconductors using etching and cleaning gases.

Etching gases are used to etch structures into semiconductors. The gases are introduced into the chambers, converted into plasma, and then the plasma reacts with the exposed surface of a masked semiconductor to remove the exposed material from a film deposited on a substrate. The gases can be selective for the given film over a particular substrate. For example, $CF_4/O_2$, $SF_6$, and $CHF_3$ may be used to etch polysilicon, $CF_4$, $CF_4/O_2$ and $CH2F2$ may be used in etching $Si_3N_4$ films.

However, it is understood that that these gases may generate relatively high amounts of toxic waste gases, which may pose additional GWP or Environmental, Health, and Safety (EHS) issues apart from the GWP of the cleaning or etch gas itself. Thus, there is a need in the art to reduce the harm of global warming caused by the cleaning and operation of CVD reactors with an effective and inexpensive cleaning/etching gas that has a high etch rate and a lower GWP and ESH impact than incumbent gases.

BRIEF SUMMARY OF THE INVENTION

The present invention provides a clean or etch gas mixture that have low EHS and GWP, so that even if unreacted gases are released, they have reduced environmental impact. In one aspect of the invention, the invention includes an etch gas mixture comprising at least one fluoroolefin and oxygen, wherein the fluoroolefin is selected from the group consisting essentially of CHF=CF2, Z—CF3-CF=CHF, Z—CF3-CF=CHF, CF3-CH=CF2, CF3-CF=CH2, CF3-CH=CHF, CF2=CH—CHF, CF2=CF—CF3, Z—CF3-CH=CH—CF3, E-CF3-CH=CHCF3, CF3-CF2-CH=CHF, CF3-CF2-CH=CHF, CH2=CF—CF2-CF3, CHF2-CF=CF—CHF2, Z—CF3-CF=CF—CF3, E-CF3-CF=CF—CF3, CF3-CF=CH—CF3, CF3-CF=CH—CF3, CHF=CF—CF2-CF3, CHF=CF—CF2-CF3, CF2=CF—CHF—CF3, CF2=CF—CF=CF2, CHF=C(CF3)2, CF2=C(CF3)(CHF2), CF2=CH—CH2-CF3, CH2=CF—CF2-CHF2, CF2=CF—CHF—CH2F, CF2=CFCH2CHF2, CHF=CF—CHF—CHF2, CHF2-CF=CH—CHF2, CHF2-CF=CF—CH2F, CHF2-CF=CF—CH2F, CHF2-CH=CF—CHF2, CHF2-CH=CF—CHF2, and CF3CECCF3,CHCl=CH—CF3. The invention also provides methods of using these gases, as etching gases, wherein the gases are used to etch a film on a semiconductor. In the alternative, with additional gas and oxygen, the invention provides methods of using the gases to remove deposits from the process chamber. The invention also comprises methods for cleaning the process chamber of deposits of material, comprising activating the gas, either in a remote chamber or in situ in the process chamber, wherein the gas mixture comprises an oxygen source and a hydrofluoroolefin, and contacting the activated gas with the surface deposits for a time sufficient to remove said deposits. The gas mixtures can be activated by an RF source using sufficient power for a sufficient time such that said gas mixture reaches a neutral temperature of about 800-3,000 K to form an activated gas mixture or alternatively using a glow discharge to activate the gas, and thereafter contacting said activated gas mixture with the surface deposits and thereby removing at least some of said surface deposits. The gas mixtures comprise a hydrofluoroolefin having up to four carbons (C4) with the percent fluorine equal to or higher than 65%. The gas mixture may also have a ration of H to F ratio equal to or less than 60%.

DETAILED DESCRIPTION OF THE INVENTION

Surface deposits removed with this invention include those materials commonly deposited by chemical vapor deposition (CVD) or plasma-enhanced chemical vapor deposition (PECVD) or similar processes. Such materials include nitrogen-containing deposits such as, without limitation, silicon nitride, silicon oxynitride, silicon carbonitride (SiCN), silicon boronitride (SiBN), and metal nitrides, such as tungsten nitride, titanium nitride or tantalum nitride. In one embodiment of the invention, a preferred surface deposit is silicon nitride.

In one embodiment of the invention surface deposits are removed from the interior of a process chamber that is used in fabricating electronic devices. Such a process chamber could be a CVD chamber or a PECVD chamber. Other embodiments of the invention include, but are not limited to, removing surface deposits from metals, the cleaning of plasma etching chambers and removal of N-containing thin films from a wafer. In one embodiment of the gas is used in an etching application. For example, U.S. Pat. No. 8,187,415 (incorporated herein by reference) describes a reactor having a process chamber with multiple inlets for etch and clean gas components, as a "plasma etch reactor for plasma enhanced etching of a workpiece such as a semiconductor wafer includes a housing defining a process chamber, a workpiece support configured to support a workpiece within the chamber during processing and comprising a plasma bias power electrode. The reactor further includes a first process gas inlet coupled to receive predominantly or pure oxygen gas and a second process gas inlet coupled to receive a polymerizing etch process gas. The reactor has a ceiling plasma source power electrode including a center circular gas disperser configured to receive a process gas from the first process gas inlet and to distribute the process gas into the chamber over the workpiece, and an inner annular gas disperser centered around the center gas disperser configured to receive the process gas from the second process gas inlet and to distribute the process gas into the chamber over the workpiece through an inner plurality of injection ports."

In one embodiment, the process of the present invention involves an activating step wherein a cleaning gas mixture is activated in a remote chamber. Activation may be accomplished by any means allowing for the achievement of dissociation of a large fraction of the feed gas, such as: radio frequency (RF) energy, direct current (DC) energy, laser illumination, and microwave energy. One embodiment of this invention is using transformer coupled inductively coupled lower frequency RF power sources in which the plasma has a toroidal configuration and acts as the secondary of the transformer. The use of lower frequency RF power allows the use of magnetic cores that enhance the inductive coupling with respect to capacitive coupling; thereby allowing the more efficient transfer of energy to the plasma without excessive ion bombardment which limits the lifetime of the remote plasma source chamber interior. Typical RF power used in this invention has a frequency lower than 1000 kHz. In another embodiment of this invention the power source is a remote microwave, inductively, or capacitively coupled plasma source. In yet another embodiment of the invention, the gas is activated using a glow discharge.

Activation of the cleaning gas mixture uses sufficient power for a sufficient time to form an activated gas mixture. In one embodiment of the invention the activated gas mixture has a neutral temperature on the order of at least about 1000-3,000 K. The neutral temperature of the resulting plasma depends on the power and the residence time of the gas mixture in the remote chamber. Under certain power input and conditions, neutral temperature will be higher with longer residence times. In one embodiment of the invention, a preferred neutral temperature of the activated gas mixture is over about 3,000 K. Under appropriate conditions (considering power, gas composition, gas pressure and gas residence time), neutral temperatures of at least about 1000-5,000 K may be achieved.

Table 1 depicts fluoroolefins, including hydrofluoroolefins (HFOs), that have use in etch gas applications. Preferred HFOs have up to four carbons (C4) with the percent fluorine equal to or higher than 65% (F %>65%). Preferably, the HFOs have an H to F ratio equal to or less than 60%. Preferably, the HFOs may be blended with oxygen is a HFO/O2 ration of 0.1-3:1.0-0.1 or existing etch/cleaning gases, or both. Preferably, the blend is further mixed with a carrier gas, such as argon, helium or nitrogen.

TABLE 1

| HFO (TO C4) with F % >65% & HF ratio <60% | | MW | % F | H/F ratio | F/C ratio | B.p (C.) |
|---|---|---|---|---|---|---|
| HFO-1123 | CHF=CF2 | 82.0 | 69% | 33.3% | 1.7 | −51 |
| Z-HFO-1225ye | Z—CF3—CF=CHF | 132.0 | 72% | 20.0% | 1.7 | −19 |
| Z-HFO1225ye | Z—CF3—CF=CHF | 132.0 | 72% | 20.0% | 1.7 | −14 |
| HFO-1225zc | CF3—CH=CF2 | 132.0 | 72% | 20.0% | 1.3 | −22 |
| HFO_1234YF | CF3—CF=CH2 | 114.0 | 67% | 50.0% | 1.3 | −29 |
| HFO-E-F1234ZE | CF3—CH=CHF | 114.0 | 67% | 50.0% | 1.3 | −19 |
| HFO-Z-F1234ze | CF2=CH—CHF | 114.0 | 67% | 50.0% | 2.0 | 9 |
| HFO-1216 | CF2=CF—CF3 | 150.0 | 76% | 50.0% | 1.5 | −30 |
| HFO-Z-1336mzz | CF3CH=CH—CF3 (Z isomer) | 164.0 | 70% | 33.3% | 1.5 | 33 |
| HFO-E-1336mzz | CF3—CH=CHCF3 (E-isomer) | 164.0 | 70% | 33.3% | 1.5 | 7.5 |
| HFO-Z-1336ze | CF3—CF2—CH=CHF (Z isomer) | 164.0 | 70% | 33.3% | 1.5 | 31 |
| HFO-E-1336ze | CF3—CF2—CH=CHF (E isomer) | 164.0 | 70% | 33.3% | 1.5 | 11 |
| HFO-1336yf | CH2=CF—CF2—CF3 | 164.0 | 70% | 33.3% | 1.5 | 5 |
| HFO-1336pyy | CHF2—CF=CF—CHF2 | 164.0 | 70% | 33.3% | 2.0 | ~61 |
| Z-PFC-1318my | CF3—CF=CF—CF3 (Z isomer) | 200.0 | 76% | 0.0% | 2.0 | 0 |
| E-PFC-1318my | CF3—CF=CF—CF3 (E isomer) | 200.0 | 76% | 0.0% | 1.8 | 0 |
| E-HFOC-1327myz | CF3—CF=CH—CF3 (E isomer) | 182.0 | 73% | 14.3% | 1.8 | ~10 |
| F-HFOC-1327myz | CF3—CF=CH—CF3 (Z isomer) | 182.0 | 73% | 14.3% | 1.8 | ~10 |
| E-HFO-1327ye | CHF=CF—CF2—CF3 (E isomer) | 182.0 | 73% | 14.3% | 1.8 | 10 |
| Z-HFO-1327ye | CHF=CF—CF2—CF3 (Z isomer) | 182.0 | 73% | 14.3% | 1.8 | 10 |
| HFO-1327cze | CF2=CF—CHF—CF3 | 182.0 | 73% | 14.3% | 1.8 | ~16 |
| HFO-1327et | CHF=C(CF3)2 | 182.0 | 73% | 14.3% | 1.8 | 18-24 |
| HFO-1327 | CF2=C(CF3)(CHF2) | 182.0 | 73% | 14.3% | 1.3 | 18-24 |
| HFO-1345czf | CF2=CH—CH2—CF3 | 146.1 | 65% | 60% | 1.3 | ~8 |
| HFO-1345fyc | CH2=CF—CF2—CHF2 | 146.1 | 65% | 60% | 1.3 | ~18 |
| HFO-1345cye | CF2=CF—CHF—CH2F | 146.1 | 65% | 60% | 1.3 | ~52 |
| HFO-1345cyf | CF2=CFCH2CHF2 | 146.1 | 65% | 60% | 1.3 | ~44 |
| HFO-1345eye | CHF=CF—CHF—CHF2 | 146.1 | 65% | 60% | 1.3 | ~52 |
| HFO-1345pyz | CHF2—CF=CH—CHF2 | 146.1 | 65% | 60% | 1.3 | ~55 |
| E-HFO-1345pyy | CHF2—CF=CF—CH2F | 146.1 | 65% | 60% | 1.3 | ~74 |

TABLE 1-continued

| HFO (TO C4) with F % >65% & HF ratio <60% | | MW | % F | H/F ratio | F/C ratio | B.p (C.) |
|---|---|---|---|---|---|---|
| Z-HFO-1345pyy | CHF2—CF=CF—CH2F | 146.1 | 65% | 60% | 1.3 | ~74 |
| E-HFO-1345zy | CHF2—CH=CF—CHF2 (E isomer) | 146.1 | 65% | 60% | 1.3 | ~55 |
| Z-HFO-1345zy | CHF2—CH=CF—CHF2 (Z isomer) | 146.1 | 65% | 60% | 1.5 | ~55 |
| PFBY2 | CF3C≡CCF3 | 162.0 | 70% | 0% | 1.5 | −24 |
| HFO-1233zd | CHCl=CH—CF3 | 130 | 67% | 50% | 1.3 | 19 |

Hydrochlorofluoroolefins, such as HFO-1233zd, 1-chloro-3,3,3-trifluoropropene, may also be used as a hydrofluoroolefin.

The activated gas may be formed in a separate, remote chamber that is outside of the process chamber, but in close proximity to the process chamber. In this invention, remote chamber refers to the chamber other than the cleaning or process chamber, wherein the activated gas plasma may be generated, and process chamber refers to the chamber wherein the surface deposits are located. The remote chamber is connected to the process chamber by a conduit or other means allowing for transfer of the activated gas from the remote chamber to the process chamber. For example, the transport passage may comprise a short connecting tube and a showerhead of the CVD/PECVD process chamber. The remote chamber and means for connecting the remote chamber with the process chamber are constructed of materials known in this field to be capable of containing activated gas mixtures. For instance, ceramics, aluminum and anodized aluminum are commonly used for the chamber components. Sometimes $Al_2O_3$ is coated on the interior surface to reduce the surface recombination. In other embodiments of the invention, the activated gas mixture may be formed directly in the process chamber.

The etch gas or etch gas mixture that is activated to form the activated gas comprises at least one fluoroolefin. As used herein, an etch gas or etch gas mixture is defined as a gas or mixture of gases that are used in semiconductor manufacture that are activated to form a plasma, where the plasma may be used for etching a surface of the semiconductor, depositing a polymer layer on the surface of the semiconductor, or cleaning the process chamber of the device used in semiconductor manufacture. When used to etch a surface or clean the chamber, the etch gas may further comprise an oxygen source, a nitrogen source or an inorganic fluorine source. Typical inorganic fluorine sources include $NF_3$ and $SF_6$. A fluoroolefin of the present invention is defined as a compound comprising C and F and comprising at least one unsaturation site, i.e. a carbon carbon double or triple bond. Similarly hydrofluoroolefin of the invention is herein referred to as a compound comprising of C, H and F and having at least unsaturation site, i.e. a carbon-carbon double bond or triple bond. In one embodiment of the invention, the gas mixture further comprises a perfluorocarbon or hydrofluorocarbon. A perfluorocarbon compound as referred to in this invention is a compound consisting of C, F and optionally oxygen. A hydrofluorocarbon compound as referred to in this invention is a compound consisting of C, F, H, and optionally oxygen. Perfluorocarbon compounds include, but are not limited to tetrafluoromethane, hexafluoroethane, octafluoropropane, hexafluororcyclopropane, decafluorobutane, octafluorocyclobutane hexafluoropropene, hexafluoropropylene oxide, hydrofluoroacetone, 2,3,3-trifluor-3-(trifluoromethyl) oxirane, 1,1,1,3,3,3-hexafluoro-2-propanone, octofluoro-2-butene, hexafluoro-1,3-dibutene, C5F8, C4F10, and octafluorotetrahydrofuran, Hydrofluorocarbons include CHF3, CH2F2, HFC-134a, HFC-125, and HFC-152a. Hydrochlorofluoroolefins, such as HFO-1233zd, 1-chloro-3,3,3-trifluoropropene, may also be used as a hydrofluoroolefin. Blends of any of the foregoing may also be mixed with the hydrofluoroolefins.

Without wishing to be bound by any particular theory, applicant believes that the hydrofluoroolefin of the gas mixture serves as a source of atoms at a more preferred ratios of hydrogen to fluorine, and more preferred ratios of fluorine to carbon, in the activated gas mixture. In certain blends to include nitrogen, typical nitrogen sources include molecular nitrogen ($N_2$) and $NF_3$. When $NF_3$ is the inorganic fluorine source, it can also serve as the nitrogen source. Typical oxygen sources include molecular oxygen ($O_2$). When the fluorocarbon is octafluorotetrahydrofuran or other oxygen containing fluorocarbon, that can also serve as the oxygen source. In one embodiment of the invention, the oxygen:hydrofluoroolefin molar ration is at least 0.3:1. In another embodiment of the invention, the oxygen:hydrofluoroolefin molar ratio is at least 0.5:1. In another embodiment, the oxygen to hydrofluoroolefin ration is at least 1-3:1. Depending on the hydrofluoroolefin chosen, in other embodiments of the invention the oxygen:hydrofluoroolefin molar ratio may be 1-4:1.

The gas mixture that is activated to form the activated gas mixture of the invention may further comprise a carrier gas. Examples of suitable carrier gasses include noble gasses such as argon and helium.

In an embodiment of the invention, the temperature in the process chamber during etching the semiconductor surface or deposition of the polymer layer may be from about −50° C. to about 150° C.

In an embodiment of the invention, the temperature in the process chamber during removal of the surface deposits may be from about 50° C. to about 150° C.

The total pressure in the remote chamber during the activating step may be between about 0.5 torr and about 20 torr using the Astron source. The total pressure in the process chamber may be between about 0.5 torr and about 15 torr. With other types of remote plasma sources or in situ plasmas the pressure ranges.

It is found in this invention that the combination of oxygen and a fluoroolefin results in high etching rates of nitride films such as silicon nitride. These increases also provide lower sensitivity of the etch rate to variations in source gas pressure, chamber pressure and temperature.

The following Examples are meant to illustrate the invention and are not meant to be limiting.

Example 1 to Example 7

In examples 1 to 7, the remote plasma source is a commercial toroidal-type MKS ASTRON®ex reactive gas generator unit make by MKS Instruments, Andover, Mass., USA. The feed gases (e.g. oxygen, hydrofluoroolefin, and carrier gas) are introduced into the remote plasma source and passed through the toroidal discharge where they were discharged by the 400 kHz radio-frequency power to form an activated gas mixture. The oxygen is manufactured by Airgas with 99.999% purity. The hydrofluoroolefin is selected from Table 1. Argon is manufactured by Airgas with a grade of 5.0. Typically, Ar gas is used to ignite the plasmas, after which timed flows for the feed gases were initiated, after Ar flow was halted. The activated gas mixture then is passed through an aluminum water-cooled heat exchanger to reduce the thermal loading of the aluminum process chamber. The surface deposits covered wafer is placed on a temperature controlled mounting in the process chamber. The neutral temperature is measured by Optical Emission Spectroscopy (OES), in which rotovibrational transition bands of diatomic species like $C_2$ and $N_2$ are theoretically fitted to yield neutral temperature. The etching rate of surface deposits by the activated gas is measured by interferometry equipment in the process chamber. Any $N_2$ gas is added a the entrance of the exhaustion pump both to dilute the products to a proper concentration for FTIR measurement and to reduce the hang-up of products in the pump. FTIR is used to measure the concentration of species in the pump exhaust.

Example 1

This example illustrates the effect of the addition of hydrofluoroolefin HFO-1234yf with oxygen on the silicon nitride etch rate. In this experiment, the feed gas is composed of oxygen and HFO-1234yf. at molar ratios of O2 to HFO of 0.4 to 1, 0.6 to 1, 1 to 1, and 1.2 to 1. Process chamber pressure is 5 torr. Total gas flow rate is from 1500-2000 sccm, with flow rates for the individual gases set proportionally as required for each experiment. The feeding gas is activated by the 400 kHz 5.9-8.7 kW RF power to an effective neutral temperature. The activated gas then enters the process chamber and etches the silicon nitride surface deposits on the mounting with the temperature controlled at 50° C. The etch rate is over 1900 A/min. The same phenomena is observed in all wafer temperatures tested: 50° C., 100° C. and 150° C.

Example 2

This example illustrates the effect of the addition of hydrofluoroolefin HFO-1336mzz with oxygen on silicon nitride etch rate. In this experiment, the feed gas is composed of oxygen and HFO-1336mzz, at molar ratios of O2 to HFO of 0.4 to 1, 0.6 to 1, 1 to 1, and 1.2 to 1. Process chamber pressure is 5 torr. Total gas flow rate is from 1500-2000 sccm, with flow rates for the individual gases set proportionally as required for each experiment. The feeding gas is activated by the 400 kHz 5.9-8.7 kW RF power to an effective neutral temperature. The activated gas then enters the process chamber and etches the silicon nitride surface deposits on the mounting with the temperature controlled at 50° C. The etch rate is over 2050 A/min. The same phenomena is observed in all wafer temperatures tested: 50° C., 100° C. and 150° C.

Example 3

This example illustrates the effect of the addition of a high-fluorine blend comprising hydrofluoroolefin HFO-1336mzz and CF4, with oxygen on silicon nitride etch rate. In this experiment, the feed gas is composed of oxygen and a 1:1 HFO-1336mzz:CF4 at molar ratios of O2 to high fluorine blend of 0.4 to 1, 0.6 to 1, 1 to 1, and 1.2 to 1. Process chamber pressure is 5 torr. Total gas flow rate is from 1500-2000 sccm, with flow rates for the individual gases set proportionally as required for each experiment. The feeding gas is activated by the 400 kHz 5.9-8.7 kW RF power to an effective neutral temperature. The activated gas then enters the process chamber and etches the silicon nitride surface deposits on the mounting with the temperature controlled at 50° C. The etch rate is over 2100 A/min. The same phenomena is observed in all wafer temperatures tested: 50° C., 100° C. and 150° C.

Example 4

This example illustrates the effect of the addition of a high-fluroine blend, hydrofluoroolefin HFO-1234yf and NF3 and with oxygen on silicon nitride etch rate. In this experiment, the feed gas is composed of oxygen and a 1:1 HFO-1234yf:NF3, at molar ratios of O2 to high fluorine blend of 0.4 to 1, 0.6 to 1, 1 to 1, and 1.2 to 1. Process chamber pressure is 5 torr. Total gas flow rate is from 1500-2000 sccm, with flow rates for the individual gases set proportionally as required for each experiment. The feeding gas is activated by the 400 kHz 5.9-8.7 kW RF power to an effective neutral temperature. The activated gas then enters the process chamber and etches the silicon nitride surface deposits on the mounting with the temperature controlled at 50° C. The etch rate is over 2000 A/min. The same phenomena is observed in all wafer temperatures tested: 50° C., 100° C. and 150° C.

Example 5

This example illustrates the effect of the addition of a high-fluroine blend, hydrofluoroolefin HFO-1234yf and C2F6, and with oxygen on silicon nitride etch rate. In this experiment, the feed gas is composed of oxygen and a 1:1 HFO-1234yf:C2F6, at molar ratios of O2 to high fluorine blend of 0.4 to 1, 0.6 to 1, 1 to 1, and 1.2 to 1. Process chamber pressure is 5 torr. Total gas flow rate is from 1500-2000 sccm, with flow rates for the individual gases set proportionally as required for each experiment. The feeding gas is activated by the 400 kHz 5.9-8.7 kW RF power to an effective neutral temperature. The activated gas then enters the process chamber and etches the silicon nitride surface deposits on the mounting with the temperature controlled at 50° C. The etch rate is over 2000 A/min. The same phenomena is observed in all wafer temperatures tested: 50° C., 100° C. and 150° C.

Example 6

This example illustrates the effect of the addition of a high-fluroine blend, hydrofluoroolefin HFO-1234yf and SF6, and with oxygen on silicon nitride etch rate. In this experiment, the feed gas is composed of oxygen and a 1:1 HFO-1234yf:SF6, at molar ratios of O2 to high fluorine blend of 0.4 to 1, 0.6 to 1, 1 to 1, and 1.2 to 1. Process chamber pressure is 5 torr. Total gas flow rate is from 1500-2000 sccm, with flow rates for the individual gases set proportionally as required for each experiment. The feeding gas is activated by the 400 kHz 5.9-8.7 kW RF power to an effective neutral temperature. The activated gas then enters the process chamber and etches the silicon nitride surface deposits on the mounting with the temperature controlled at 50° C. The etch rate is over 2000 A/min. The same phenomena is observed in all wafer temperatures tested: 50° C., 100° C. and 150° C.

Example 7

This example illustrates the effect of the addition of a hydrofluoroolefin HFO-1234yf and NF3 and with oxygen on silicon nitride etch rate. In this experiment, the feed gas is composed of oxygen and a 1:1 HFO-1234yf:NF3, at molar ratios of O2 to high fluorine blend of 0.4 to 1, 0.6 to 1, 1 to 1, and 1.2 to 1. Process chamber pressure is 5 torr. Total gas flow rate is from 1500-2000 sccm, with flow rates for the individual gases set proportionally as required for each experiment. The feeding gas is activated by the 400 kHz 5.9-8.7 kW RF power to an effective neutral temperature. The activated gas then enters the process chamber and etches the silicon nitride surface deposits on the mounting with the temperature controlled at 50° C. The etch rate is over 2000 A/min. The same phenomena is observed in all wafer temperatures tested: 50° C., 100° C. and 150° C.

Example 8 to Example 12

In examples 8 to 12, the RF plasma source is a commercial toroidal-type generator unit made by ASTECH. The feed gases (e.g. oxygen, argon, 1,1,1,4,4,4-hexafluoro-2-butyne) are introduced into the RF plasma source and passed through the toroidal discharge where they were discharged by the 80 MHz radio-frequency power to form an activated gas mixture. The oxygen and argon used are manufactured by Air Products San FU Co. Ltd. with 99.999% purity. The activated gas mixture is then passed through an aluminum water-cooled heat exchanger to reduce the thermal loading of the aluminum process chamber. The surface deposits covered wafer is placed on a temperature controlled mounting in the process chamber.

Example 8

This example illustrates the effect of the addition of 1,1,1,4,4,4-hexafluoro-2-butyne with oxygen on the silicon nitride etch rate as CVD chamber cleaning application. In this experiment, the feed gas is composed of oxygen and 1,1,1,4,4,4-hexafluoro-2-butyne at molar ratios of O2 to HFO of 1 to 1, 1.5 to 1, 2.3 to 1, 4 to 1, and 9 to 1. Process chamber pressure is 1 torr. Total gas flow rate is fixed as 200 sccm, with flow rates for the individual gases set as required for each experiment. The feeding gas is activated by 400 W RF power. The activated gas then enters the process chamber and etches the silicon nitride surface deposits on the mounting with the temperature controlled at 200° C. The best etch rate is 3,000 A/min at 90% oxygen mixture.

Example 9

This example illustrates the effect of mixture of hydrofluoroolefin HFO-1234yf and 1,1,1,4,4,4-hexafluoro-2-butyne on silicon oxide etch rate as etching application. In this experiment, the feed gas is composed of 20 sccm HFO-1234yf, 20 sccm 1,1,1,4,4,4-hexafluoro-2-butyne, 20 sccm O2 and 200 sccm Ar. Process chamber pressure is 15 mtorr. The feeding gas is activated by the 1800 W RF power. The activated gas then enters the process chamber and etches the substrate which has a pattern of a novolak type photoresist with a hole diameter of 0.2 micrometer on silicon oxide layer on silicon layer. The temperature of the substrate is controlled at 20° C. The etch rate with the above recipe was 5,300 A/min, and the selectivity of SiO2/photoresist is 10.

Example 10

This example illustrates the effect of mixture of hydrofluoroolefin HFO-1234yf and hexafluoro-1,3-butadiene on silicon oxide etch rate as etching application. In this experiment, the feed gas is composed of 20 sccm HFO-1234yf, 20 sccm hexafluoro-1,3-butadiene, 20 sccm O2 and 200 sccm Ar. Process chamber pressure is 15 mtorr. The feeding gas is activated by the 1800 W RF power. The activated gas then enters the process chamber and etches the substrate which has a pattern of a novolak type photoresist with a hole diameter of 0.2 micrometer on silicon oxide layer on silicon layer. The temperature of the substrate is controlled at 20° C. The etch rate with the above recipe was 5,300 A/min, and the selectivity of SiO2/photoresist is 8.

Example 11

This example illustrates the effect of mixture of 1,1,1,4,4,4-hexafluoro-2-butyne and hexafluoro-1,3-butadiene on silicon oxide etch rate as etching application. In this experiment, the feed gas is composed of 20 sccm 1,1,1,4,4,4-hexafluoro-2-butyne, 20 sccm hexafluoro-1,3-butadiene, 20 sccm O2 and 200 sccm Ar. Process chamber pressure is 15 mtorr. The feeding gas is activated by the 1800 W RF power. The activated gas then enters the process chamber and etches the substrate which has a pattern of a novolak type photoresist with a hole diameter of 0.2 micrometer on silicon oxide layer on silicon layer. The temperature of the substrate is controlled at 20° C. The etch rate with the above recipe was 5,500 A/min, and the selectivity of SiO2/photoresist is 5.

Example 12

This example illustrates the effect of mixture of 1,1,1,4,4,4-hexafluoro-2-butyne and trans-1,1,1,4,4,4-hexafluoro-2-butene on silicon oxide etch rate as etching application. In this experiment, the feed gas is composed of 20 sccm 1,1,1,4,4,4-hexafluoro-2-butyne, 20 sccm trans-1,1,1,4,4,4-hexafluoro-2-butene, 20 sccm O2 and 200 sccm Ar. Process chamber pressure is 15 mtorr. The feeding gas is activated by the 1800 W RF power. The activated gas then enters the process chamber and etches the substrate which has a pattern of a novolak type photoresist with a hole diameter of 0.2 micrometer on silicon oxide layer on silicon layer. The temperature of the substrate is controlled at 20° C. The etch rate with the above recipe was 5,300 A/min, and the selectivity of SiO2/photoresist is 10. Instead of trans-1,1,1,4,4,4-hexafluoro-2-butene, mixture of hexafluoro-2-butyne and cis-1,1,1,4,4,4-hexafluoro-2-butene indicates similar results of the above mixture.

While specific embodiments of the invention have been shown and described, further modifications and improvements will occur to those skilled in the art. It is desired that it be understood, therefore, that the invention is not limited to the particular form shown and it is intended in the appended claims which follow to cover all modifications which do not depart from the spirit and scope of the invention.

What is claimed is:

1. A method of operation of a semiconductor manufacturing process chamber, comprising etching a film on a semiconductor using an etch gas comprising a first fluoroolefin and a second fluoroolefin, wherein the first fluoroolefin is cis-1,1,1,4,4,4-hexafluoro-2-butene and the second fluoroolefin is 1,1,1,4,4,4-hexafluoro-2-butyne.

2. The method of claim 1, wherein the step of etching a film further comprises
transferring a photomask to the semiconductor to create a masked surface and an exposed surface,
forming a plasma of said etch gas, and
exposing the exposed surface of the semiconductor to the plasma to remove portions of the exposed surface of the semiconductor to form an etched surface of the semiconductor.

3. The method of claim 2, wherein the method further comprises the steps of forming a second etch gas, activating the second etch gas to form a second plasma, depositing the second plasma on the etched surface to form a polymer layer on the etched surface of the semiconductor.

4. The method of claim 2 wherein the said surface film is selected from the group consisting of silicon oxide, gallium nitride, silicon nitride, silicon oxynitride, silicon carbonitride, tungsten nitride, titanium nitride, and tantalum nitride.

5. The method of claim 2, wherein step of forming a plasma from the etch gas is performed in a remote chamber or in the process chamber.

6. The method of claim 5, wherein the pressure in the process chamber is no more than 30 torr.

7. The method of claim 5, wherein the pressure in the remote chamber is from 0.5 torr to 50 torr.

8. The method of claim 1, wherein the etch gas further comprises oxygen in molar ratio of oxygen:fluoroolefin that is at least about 1:1.

9. A method for removing surface deposits from a surface in a process chamber, comprising: activating a gas mixture comprising oxygen, a first fluoroolefin, and a second fluoroolefin wherein the molar percentage of fluroolefin in the said gas mixture is from about 5% to about 99%, and contacting said activated gas mixture with the surface deposits and thereby removing at least some of said deposits; wherein the first fluoroolefin is cis-1,1,1,4,4,4-hexafluoro-2-butene and the second fluoroolefin is 1,1,1,4,4,4-hexafluoro-2-butyne.

10. The method of claim 9, wherein said process chamber is the interior of a deposition chamber that is used in fabricating electronic devices.

11. The method of claim 9, wherein the step of activating said gas mixture takes place in a remote chamber.

12. A method of operation of a semiconductor manufacturing process chamber, comprising etching a film on a semiconductor using an etch gas comprising a first fluoroolefin and a second fluoroolefin, wherein the first fluoroolefin is trans-1,1,1,4,4,4-hexafluoro-2-butene and the second fluoroolefin is 1,1,1,4,4,4-hexafluoro-2-butyne.

13. The method of claim 12, wherein the step of etching a film further comprises
transferring a photomask to the semiconductor to create a masked surface and an exposed surface,
forming a plasma of said etch gas, and
exposing the exposed surface of the semiconductor to the plasma to remove portions of the exposed surface of the semiconductor to form an etched surface of the semiconductor.

14. The method of claim 13, wherein the method further comprises the steps of forming a second etch gas, activating the second etch gas to form a second plasma, depositing the second plasma on the etched surface to form a polymer layer on the etched surface of the semiconductor.

15. The method of claim 13, wherein the said surface film is selected from the group consisting of silicon oxide, gallium nitride, silicon nitride, silicon oxynitride, silicon carbonitride, tungsten nitride, titanium nitride, and tantalum nitride.

16. The method of claim 13, wherein step of forming a plasma from the etch gas is performed in a remote chamber or in the process chamber.

17. The method of claim 16, wherein the pressure in the process chamber is no more than 30 torr.

18. The method of claim 16, wherein the pressure in the remote chamber is from 0.5 torr to 50 torr.

19. The method of claim 12, wherein the etch gas further comprises oxygen in molar ratio of oxygen:fluoroolefin that is at least about 1:1.

20. A method for removing surface deposits from a surface in a process chamber, comprising: activating a gas mixture comprising oxygen, a first fluoroolefin, and a second fluoroolefin wherein the molar percentage of fluoroolefin in the said gas mixture is from about 5% to about 99%, and contacting said activated gas mixture with the surface deposits and thereby removing at least some of said deposits; wherein the first fluoroolefin is trans-1,1,1,4,4,4-hexafluoro-2-butene and the second fluoroolefin is 1,1,1,4,4,4-hexafluoro-2-butyne.

21. The method of claim 20, wherein said process chamber is the interior of a deposition chamber that is used in fabricating electronic devices.

22. The method of claim 20, wherein the step of activating said gas mixture takes place in a remote chamber.

* * * * *